(12) United States Patent
Chien et al.

(10) Patent No.: US 9,324,752 B2
(45) Date of Patent: Apr. 26, 2016

(54) IMAGE SENSOR DEVICE WITH LIGHT BLOCKING STRUCTURE

(71) Applicant: Taiwan Semiconductor Manufacturing Co., Ltd, Hsin-Chu (TW)

(72) Inventors: Volume Chien, Tainan (TW); Kun-Huei Lin, Tainan (TW); Chia-Yu Wei, Tainan (TW); Allen Tseng, Kaohsiung (TW); Chi-Cherng Jeng, Tainan (TW); Chuan-Pu Liu, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/192,322

(22) Filed: Feb. 27, 2014

(65) Prior Publication Data
US 2015/0243696 A1    Aug. 27, 2015

(51) Int. Cl.
*H01L 27/148* (2006.01)
*H01L 27/146* (2006.01)

(52) U.S. Cl.
CPC ...... *H01L 27/14623* (2013.01); *H01L 27/1463* (2013.01); *H01L 27/14685* (2013.01); *H01L 27/1464* (2013.01); *H01L 27/14621* (2013.01); *H01L 27/14627* (2013.01)

(58) Field of Classification Search
CPC ............ H01L 31/02164; H01L 27/14818; H01L 27/1463; H01L 27/14623; H01L 27/1464; H01L 27/14689; H01L 27/14629; H01L 27/14687; H01L 21/823878; H01L 27/1203; H01L 27/14632; H01L 27/14645; H01L 27/14692; H01L 27/14698

USPC .......................... 257/252, 292, 432, 435–437
See application file for complete search history.

(56) References Cited

U.S. PATENT DOCUMENTS

| | | |
|---|---|---|
| 5,611,941 A | 3/1997 | Booth |
| 7,315,014 B2 | 1/2008 | Lee et al. |
| 7,477,440 B1 | 1/2009 | Huang |
| 2006/0081890 A1 | 4/2006 | Kang |
| 2010/0155868 A1* | 6/2010 | Jang .............................. 257/432 |
| 2011/0108939 A1* | 5/2011 | Marty et al. .................. 257/432 |
| 2011/0198732 A1 | 8/2011 | Lin et al. |
| 2012/0217601 A1 | 8/2012 | Miyanami |
| 2013/0249039 A1 | 9/2013 | Hsu et al. |
| 2014/0077323 A1* | 3/2014 | Velichko et al. ............. 257/432 |
| 2014/0110809 A1* | 4/2014 | Kitamura et al. ............. 257/435 |
| 2014/0239361 A1 | 8/2014 | Ma |
| 2014/0353468 A1 | 12/2014 | Choi et al. |
| 2015/0077841 A1* | 3/2015 | Matsuo et al. ............... 359/359 |
| 2015/0155327 A1 | 6/2015 | Kuboi |

OTHER PUBLICATIONS

Lee et al., "Selective removal of CuIn 1-xGaxSe2 absorber layer with no edge melting using a nanosecond Nd: YAG laser", J. Phys. D: Appl. Phys. 46 (2013) 105502. pp. 1-10, Feb. 2013.

* cited by examiner

*Primary Examiner* — Dung Le
(74) *Attorney, Agent, or Firm* — Birch, Stewart, Kolasch & Birch, LLP

(57) ABSTRACT

The disclosure provides an image sensor device and a manufacturing method. The image sensor device includes a semiconductor substrate and a light sensing region in the semiconductor substrate. The image sensor device also includes a light blocking structure in the semiconductor substrate and adjacent to the light sensing region. A sidewall of the light blocking structure is a curved surface.

20 Claims, 7 Drawing Sheets

IMAGE SENSOR DEVICE WITH LIGHT BLOCKING STRUCTURE

CROSS-REFERENCE TO RELATED APPLICATIONS

This application relates to co-pending application Ser. No. 14/192,258 filed on Feb. 27, 2014, and co-pending application Ser. No. 14/192,168 filed on Feb. 27, 2014.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. For these advances, similar developments in IC processing and manufacturing are developed.

Along with the advantages gained from reducing geometric size, improvements are being made directly to the IC devices. One such IC device is an image sensor device. An image sensor device includes a pixel array (or grid) for detecting light and recording intensity (brightness) of the detected light. For example, the pixel array responds to the light by accumulating a charge. The higher the intensity of the light is, the higher the charge is accumulated in the pixel array. The accumulated charge is used (for example, by other circuitry) to provide image information for use in a suitable application, such as a digital camera.

It is desirable to form image sensor devices with improved performance and reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
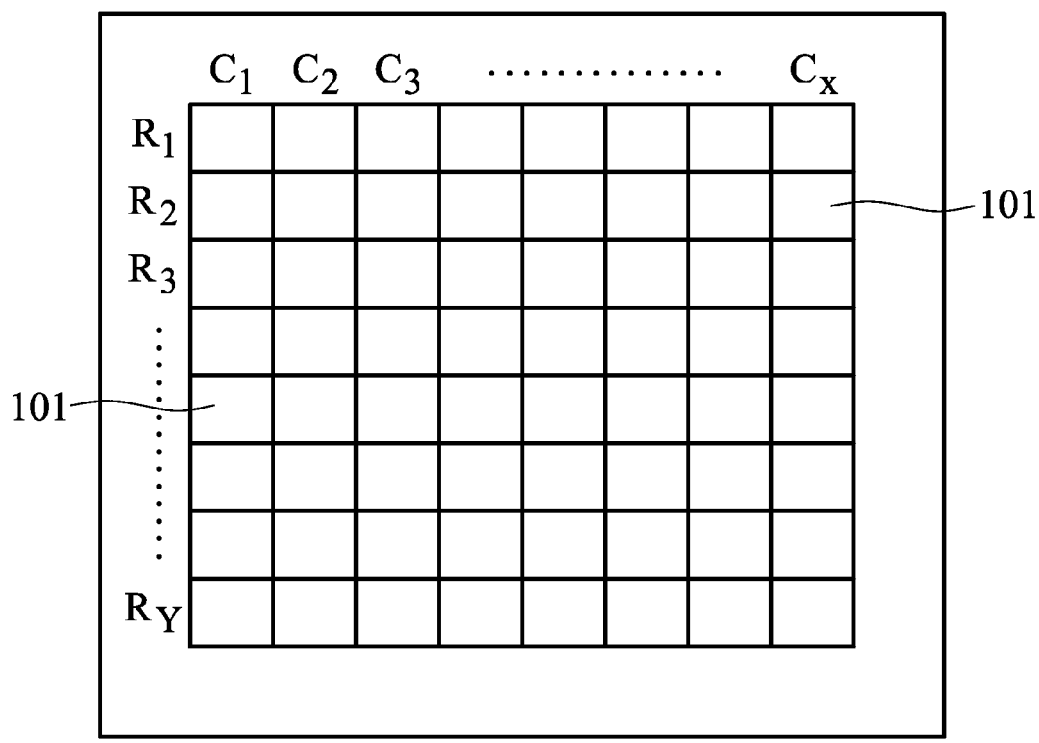
FIG. 1 is a top view of an image sensor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a top view of an image sensor device 10, in accordance with some embodiments. The image sensor device 10 may be a backside illuminated (BSI) image sensor device. However, it should be appreciated that embodiments of the disclosure are not limited to being the BSI image sensor device. In some other embodiments, the image sensor device 10 is a front side illuminated (FSI) image sensor device.

In some embodiments, the image sensor device 10 includes an array of pixel regions 101. The pixel regions 101 may be arranged into columns (for example, C1 to CX) and rows (for example, R1 to RY). The term "pixel region" refers to a unit cell containing features such as photodetector and various circuitry. The unit cell may include various semiconductor devices for converting electromagnetic radiation into an electrical signal. The photodetectors in the pixel regions 101 may include photodiodes, complimentary metal-oxide-semiconductor (CMOS) image sensors, charged coupling device (CCD) sensors, active sensors, passive sensors, other applicable sensors, or a combination thereof.

The pixel regions 101 may be designed with various sensor types. One group of pixel regions 101 may be CMOS image sensors, and another group of pixel regions 101 may be other types of sensors, such as passive sensors. In some embodiments, each pixel region 101 includes a photodetector, such as a photogate-type photodetector, for recording intensity or brightness of light (radiation). Each pixel region 101 may also include various semiconductor devices, such as various transistors.

Additional circuitry, inputs, and/or outputs may be formed in a peripheral region of the image sensor device 10 and be coupled to the pixel regions 101. The circuitry in the peripheral region provides an operation environment for the pixel regions 101 and support communications with the pixel regions 101.

Figure 2:
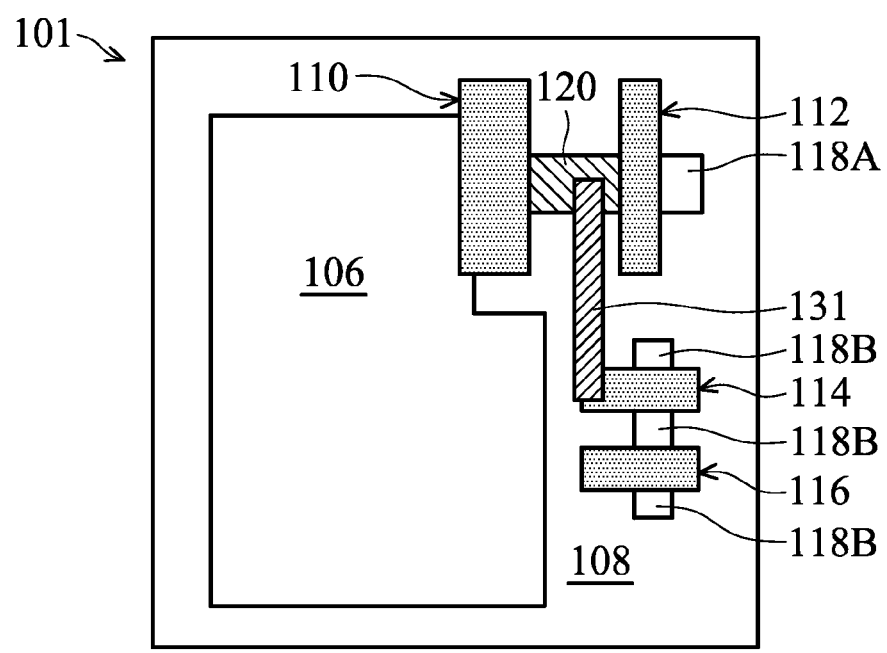
FIG. 2 is a top view of a pixel region of an image sensor device, in accordance with some embodiments.

FIG. 2 is a top view of one of the pixel regions 101 of the image sensor device 10 on a front surface of a semiconductor substrate (not illustrated in FIG. 2), in accordance with some embodiments. As shown in FIG. 2, the pixel region 101 includes a light sensing region 106. In some embodiments, the light sensing region 106 includes a photodiode for recording intensity or brightness of light (radiation). The pixel region 101 may contain various transistors. For example, the transistors include a transfer transistor 110, a reset transistor 112, a source-follower transistor 114, a select transistor 116, other suitable transistors, or a combination thereof.

The pixel region 101 may also include various doped regions in the semiconductor substrate, such as doped regions 118A, 118B, and 120. The doped regions 118A, 118B, and 120 serve as source/drain regions of the previously mentioned transistors. The doped region 120 is also referred to as a floating diffusion region in some embodiments. The doped region 120 is between the transfer transistor 110 and the reset transistor 112, and is one of the source/drain regions for the transfer transistor 110 and the reset transistor 112. In some embodiments, a conductive feature 131 overlaps a portion of a gate stack of the source-follower transistor 114 and connects to the doped region 120.

The image sensor device 10 may also include various isolation structures 108 formed in the semiconductor substrate to isolate various regions of the semiconductor substrate. The isolation structures 108 prevent leakage currents between various regions. In some embodiments, the isolation structures 108 include dielectric isolation structures. The dielectric isolation structures may be formed by using a shallow trench isolation (STI) technique, a deep trench isolation (DTI) technique, other applicable techniques, or a combination thereof.

In some embodiments, the isolation structures 108 may include doped isolation structures formed by an implantation technique or a diffusion technique. In some embodiments, the isolation structures 108 are formed in the pixel region 101 to isolate the light sensing region 106, the transfer transistor 110, the reset transistor 112, the source-follower transistor 114, and the select transistor 116.

The image sensor device 10 further includes a color filter and a lens disposed over a back surface of the semiconductor substrate in some embodiments. The color filter and the lens may be aligned with the light sensing region 106. The lens is used to direct or focus the incident light. The color filter is designed so that it filters through light of a predetermined wavelength band. For example, the color filter may filter through visible light of a red wavelength band, a green wavelength band, or a blue wavelength band to the light sensing region 106.

In the operation of the image sensor device 10 according to some embodiments, the image sensor device 10 is designed to receive radiation traveling towards the back surface of the semiconductor substrate. The lens disposed over the back surface of the semiconductor substrate directs the incident radiation to the corresponding light sensing region 106 in the semiconductor substrate. The incident radiation generates electron-hole pairs. When exposed to the incident radiation, the light sensing region 106 responds to the incident radiation by accumulating electrons. The holes may be trapped by a doped layer over the back surface of the semiconductor substrate to prevent the recombination of the electrons and the holes.

The electrons are transferred from the light sensing region 106 to the doped region 120 when the transfer transistor 110 is turned on. Through the connection of the conductive feature 131, the source-follower transistor 114 may convert the electrons from the doped region 120 to voltage signals. The select transistor 116 may allow a single row (or a single column) of the pixel array to be read by read-out electronics. The reset transistor 112 may act as a switch to reset the doped region 120. When the reset transistor 112 is turned on, the doped region 120 is connected to a power supply to clear all accumulated electrons.

It should be appreciated that embodiments of the disclosure are not limited to being the image sensor device 10 shown in FIG. 1 or 2. In some other embodiments, the image sensor device 10 includes different configurations.

In some embodiments, one or more embedded light blocking structures are formed in the semiconductor substrate between adjacent light sensing regions. The light blocking structures are used to reduce or avoid crosstalk between adjacent pixel regions. Therefore, the quantum efficiency of the image sensor device may be improved. The issues of dark current (DC) and white pixel (WP) are significantly reduced or eliminated.

Figure 3A:
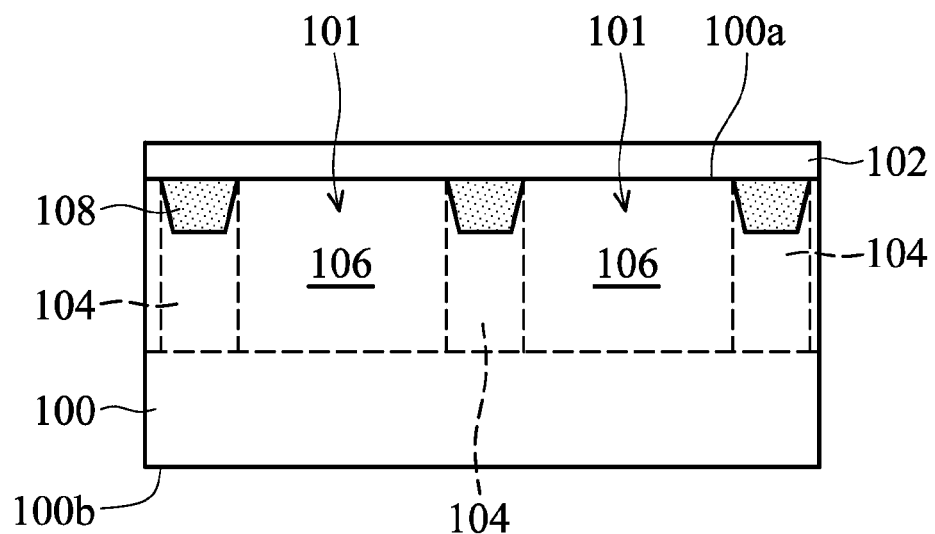
FIGS. 3A-3H are cross-sectional views of various stages of a process for forming an image sensor device, in accordance with some embodiments.

FIGS. 3A-3H are cross-sectional views of various stages of a process for forming an image sensor device, in accordance with some embodiments. Referring to FIG. 3A, a semiconductor substrate 100 is provided. The semiconductor substrate 100 has a front surface 100a and a back surface 100b. In some embodiments, the semiconductor substrate 100 is defined to mean a construction comprising one or more semiconductor materials. In some embodiments, the semiconductor substrate 100 includes a semiconductor wafer (such as a silicon wafer), or a portion of a semiconductor wafer. In some embodiments, the semiconductor substrate 100 includes an elementary semiconductor material including silicon or germanium in a single crystal, polycrystal, or amorphous structure. In some other embodiments, the semiconductor substrate 100 includes a compound semiconductor, such as silicon carbide, gallium arsenide, gallium phosphide, indium phosphide, indium arsenide, an alloy semiconductor, such as SiGe, GaAsP, AlInAs, AlGaAs, GaInAs, GaInP, GaInAsP, or a combination thereof. In some embodiments, the semiconductor substrate 100 includes multi-layer semiconductors, a semiconductor on insulator (SOI) (such as silicon on insulator or germanium on insulator), or a combination thereof. In some embodiments, the semiconductor substrate 100 is a chip, such as a chip containing image sensor devices.

As shown in FIG. 3A, the semiconductor substrate 100 includes one or more isolation structures 108, in accordance with some embodiments. The isolation structures 108 may define and/or isolate various device elements formed in the semiconductor substrate 100. The isolation structures 108 include shallow trench isolation (STI) features, local oxidation of silicon (LOCOS) features, other suitable isolation structures, or a combination thereof. In some embodiments, the isolation structures 108 include silicon oxide, silicon nitride, silicon oxynitride, fluoride-doped silicate glass (FSG), a low-K dielectric material, other suitable materials, or a combination thereof. In some embodiments, the formation of the isolation structure 108 includes patterning the semiconductor substrate 100 by a photolithography process, etching a recess, such as a trench, in the semiconductor substrate 100 (for example, by using a dry etching, wet etching, other applicable etching processes, or a combination thereof), and filling the recess (for example, by using a chemical vapor deposition process) with a dielectric material. In some embodiments, the filled trench has a multi-layer structure, such as a thermal oxide liner layer filled with silicon nitride or silicon oxide.

Examples of the various device elements, which may be formed in the semiconductor substrate 100, include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, other applicable elements, or a combination thereof. In some embodiments, similar to the embodiments shown in FIG. 2, the various device elements include the transfer transistor 110, the reset transistor 112, the source-follower transistor 114, the select transistor 116, other suitable device elements, or a combination thereof.

Various processes are performed to form the various device elements, which include, for example, deposition, photolithography, etching, implantation, annealing, planarization, and/or other suitable processes. In some embodiments, the various device elements are interconnected to form an integrated circuit device. The integrated circuit device includes, for example, an image sensor device, a logic device, a memory device (such as static random access memory (SRAM) and/or dynamic static random access memory (DRAM)), radio frequency (RF) device, input/output (I/O) device, system-on-chip (SoC) device, other applicable devices, or a combination thereof.

As shown in FIG. 3A, a number of light sensing regions 106 are formed in the semiconductor substrate 100, in accordance with some embodiments. As shown in FIG. 3A, the isolation structures 108 separate the adjacent light sensing regions 106. In some embodiments, each of the light sensing regions 106 is formed by using ion implantation processes. As shown in FIG. 3A, isolation regions 104 are formed in the semiconductor substrate 100, in accordance with some embodiments. The isolation regions 104 are used to electrically separate the adjacent light sensing regions 106. In some embodiments, the isolation regions 104 are doped regions, such as (but not limited to) p-type doped regions. Thus, the isolation regions 104 may also refer to doped isolation regions. In some embodiments, the isolation regions 104 are formed by using ion implantation processes. In some embodiments, the isolation regions 104 are formed before the isolation structures 108. In some other embodiments, the isolation regions 104 are formed after the isolation structures 108. In some embodiments, each of the isolation structures 108 is surrounded by one of the isolation regions 104.

As shown in FIG. 3A, an interconnect structure 102 is formed over the front surface 100a of the semiconductor substrate 100, in accordance with some embodiments. In some embodiments, the interconnect structure 102 includes a stack of multiple dielectric layers. The interconnect structure 102 also includes various conductive features. The conductive features include, for example, multiple horizontal interconnects, such as conductive lines, and multiple vertical interconnects, such as conductive via plugs or conductive contact plugs. The conductive features of the interconnect structure 102 form electrical connections to the device elements formed in or on the semiconductor substrate 100. The device element may be a doped region formed in or over the semiconductor substrate 100. Alternatively, the device element may be a gate electrode formed over or in the semiconductor substrate 100.

In some embodiments, the multiple dielectric layers of the interconnect structure 102 are made of silicon oxide, silicon nitride, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, other suitable materials, or a combination thereof. The low-k dielectric material may have a dielectric constant (k value) less than about 3.9 or less than about 2.8. In some embodiments, the conductive features of the interconnect structure 102 are made of copper, aluminum, tungsten, titanium, nickel, gold, platinum, other suitable materials, or a combination thereof. A number of deposition, photolithography, and etching processes may be performed to form the interconnect structure 102.

Figure 3B:
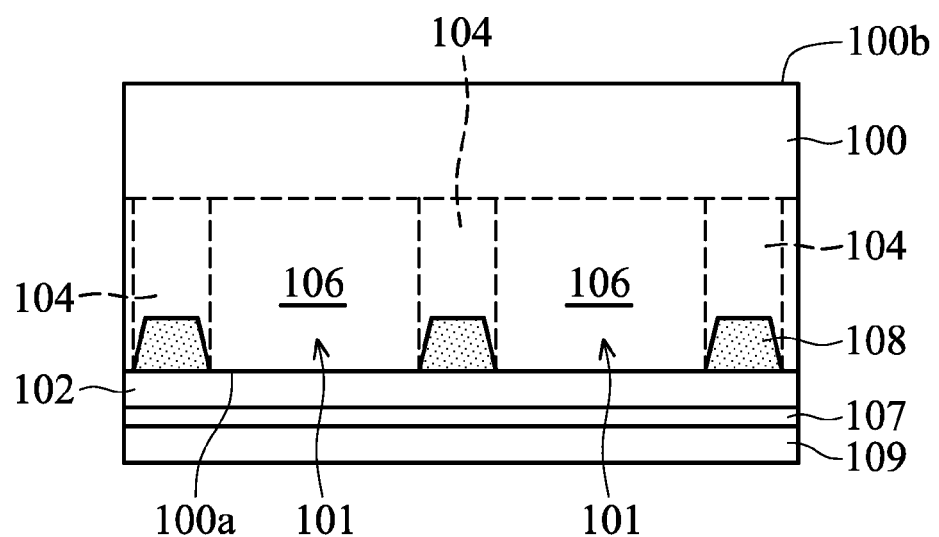

As shown in FIG. 3B, the structure shown in FIG. 3A is bonded onto a carrier substrate 109, in accordance with some embodiments. In some embodiments, an adhesion layer 107 is used to bond the interconnect structure 102 with the carrier substrate 109. In some embodiments, the carrier substrate 109 includes a semiconductor material, a dielectric material, a metal material, other suitable materials, or a combination thereof. In some embodiments, the adhesion layer 107 is not formed. The carrier substrate 109 is directly bonded onto the interconnect structure 102.

Figure 3C:
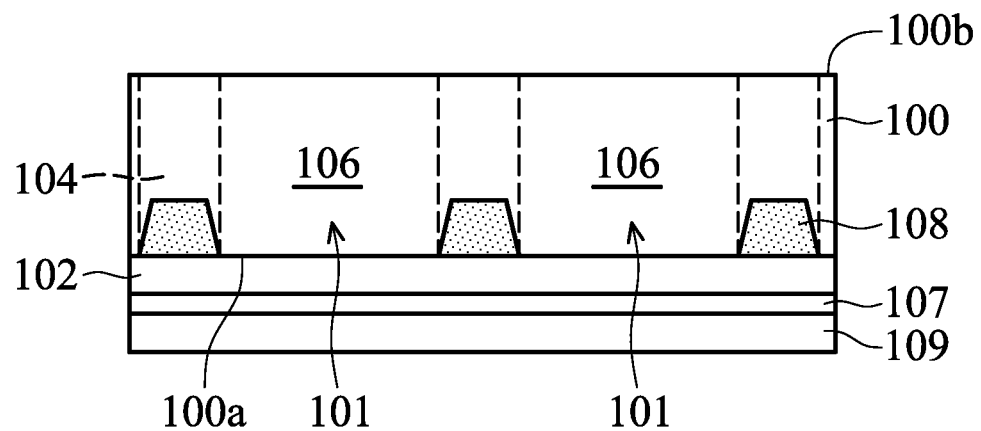

As shown in FIG. 3C, the semiconductor substrate 100 is thinned, in accordance with some embodiments. In some embodiments, the carrier substrate 109 is used as a support, and a thinning process is performed on the back surface 100b of the semiconductor substrate 100 to thin down the semiconductor substrate 100. In some embodiments, the thinning process includes a chemical mechanical polishing (CMP) process, a grinding process, an etching process, other applicable processes, or a combination thereof. However, embodiments of the disclosure are not limited thereto. In some other embodiments, the semiconductor substrate 100 is not thinned. In some embodiments, the carrier substrate 109 is not bonded with the interconnect structure 102.

Figure 3D:
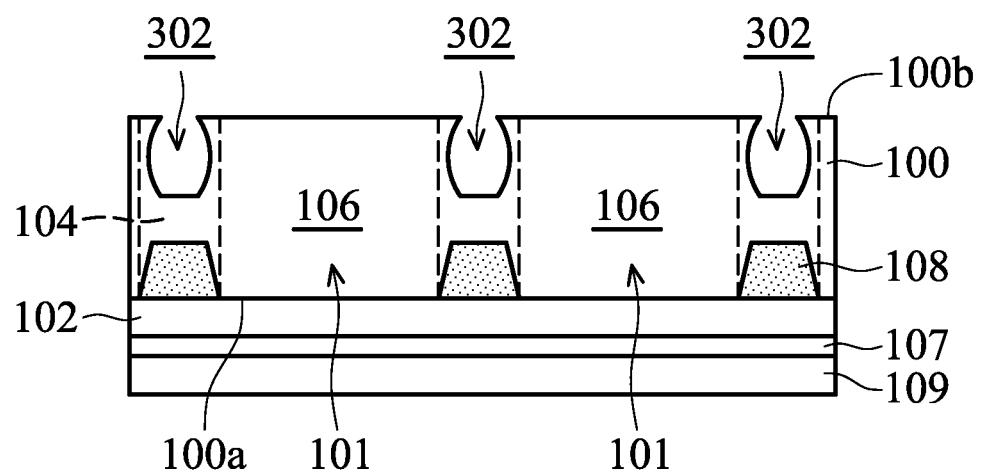

As shown in FIG. 3D, one or more recesses 302 are formed in the semiconductor substrate 100, in accordance with some embodiments. In some embodiments, a portion of the semiconductor substrate 100 is removed from the back surface 100b to form the recesses 302. In some embodiments, each of the recesses 302 is formed in one of the isolation regions 104. In some embodiments, each of the recesses 302 is formed by removing a portion of isolation region 104.

In some embodiments, the recesses 302 are formed by using a suitable etching process, such as an isotropic etching process. Therefore, damage to the semiconductor substrate 100 is prevented or reduced during the etching process for forming the recesses 302. In some embodiments, the isotropic etching process includes a wet etching process, other applicable processes, or a combination thereof. In some embodiments, a mask layer (not shown) is formed over the back surface 100b of the semiconductor substrate 100. The mask layer has openings which expose a portion of the semiconductor substrate 100 where the recesses 302 are to be formed. Afterwards, the suitable etching process, such as a wet etching process, is performed to remove a portion of the semiconductor substrate 100 through the openings of the mask layer. As a result, the recesses 302 are formed. In some embodiments, the mask layer is then removed. In some embodiments, the etchant used in the wet etching process includes tetramethylammonium hydroxide (TMAH), a mixture of nitric acid and hydrofluoric acid, KOH, NaOH, other suitable etchants, or a combination thereof.

In some embodiments, an etching process, which damages the device elements in the semiconductor substrate 100, is prevented from being used. For example, a plasma etching process is prevented from being used to form the recesses 302. Since a plasma etching process is prevented from being used to form the recesses 302, the semiconductor substrate 100 does not suffer plasma ion bombardment. Defects caused during the etching process are therefore significantly reduced or minimized. Dark current and white pixel issues are also greatly reduced.

Figure 3E:
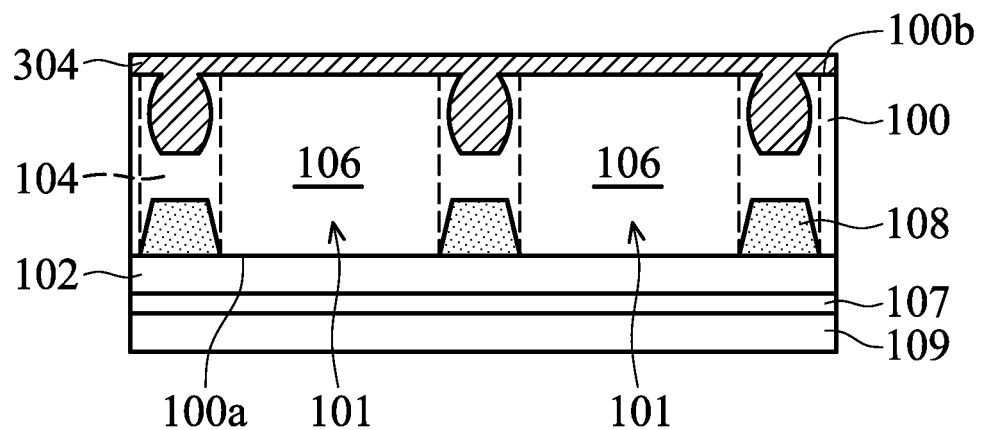

As shown in FIG. 3E, a light blocking material 304 is deposited over the semiconductor substrate 100, in accordance with some embodiments. In some embodiments, the light blocking material 304 completely fills the recesses 302. In some other embodiments, the light blocking material 304 partially fills the recesses 302. The light blocking material 304 is capable of reflecting and/or absorbing light such that an incident light is substantially prevented from penetrating through the light blocking material 304. In some embodiments, the light blocking material 304 includes a metal material, a dielectric material, a semiconductor material, other suitable materials, or a combination thereof. For example, the light blocking material 304 may be made of tungsten (W), aluminum (Al), copper (Cu), silver (Ag), gold (Au), platinum, (Pt), titanium (Ti), nickel (Ni), other suitable materials, or a combination thereof. Alternatively, the light blocking material 304 may be made of a polymer material capable of substantially absorbing the incident light. In some embodiments, the light blocking material 304 is deposited using a chemical vapor deposition (CVD) process, a physical vapor deposition (PVD) process, an electroplating process, a spin-on process, other applicable processes, or a combination thereof.

Figure 3F:
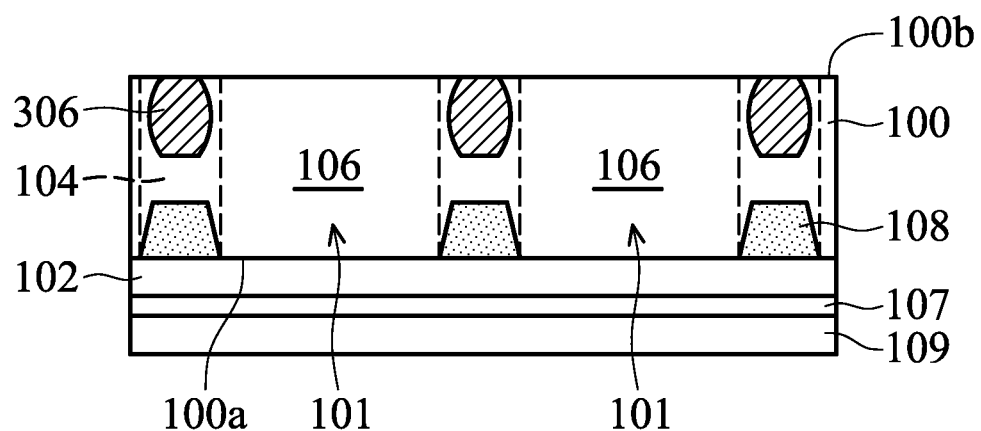

As shown in FIG. 3F, the portion of the blocking material 304 outside of the recesses 302 is removed, in accordance with some embodiments. As shown in FIG. 3F, the portion of the blocking material 304 remaining in the recesses 302 forms a number of light blocking structures 306. In some embodiments, each of the light blocking structures 306 is surrounded by one of the isolation regions 104, respectively. In some embodiments, each of the light blocking structures 306 extends from the back surface 100b towards the front surface 100a of the semiconductor substrate 100, as shown in FIG. 3F.

Figure 3G:
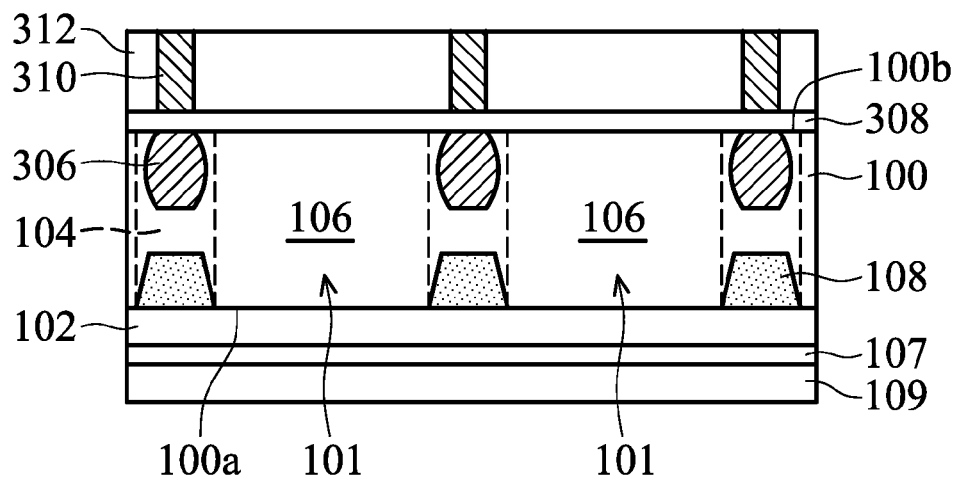
Figure 3H:
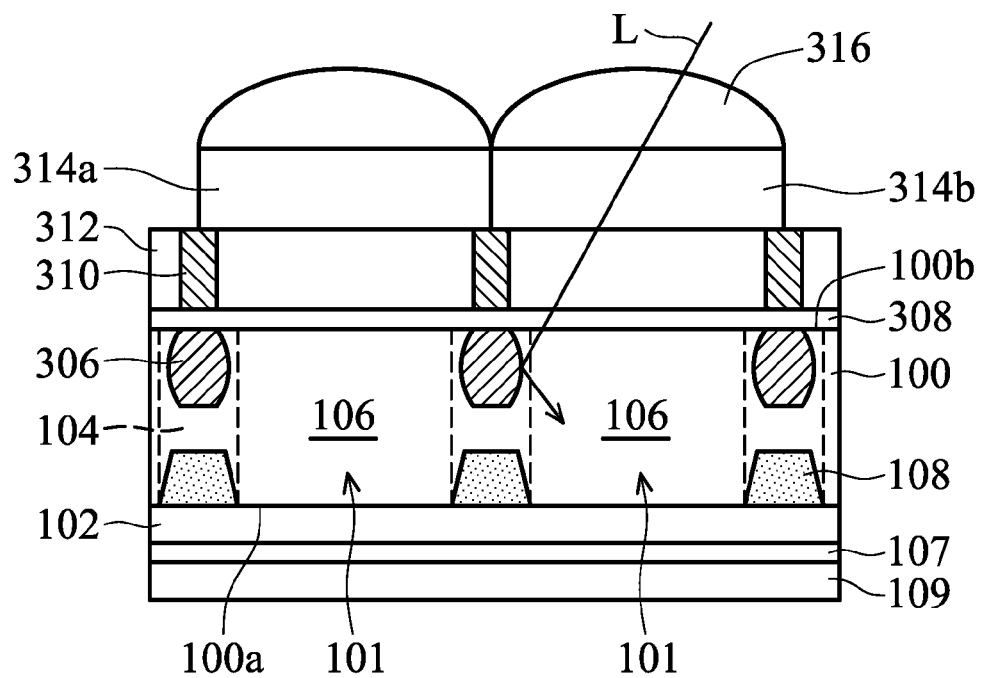

In some embodiments, one of the light blocking structures 306 and one of the isolation structures 108 are surrounded or within the same isolation region 104, as shown in FIG. 3H. In some embodiments, the light blocking structure 306 and the isolation structure 108 are substantially aligned with each other. In some embodiments, the light blocking structure 306 and the isolation structure 108 are separated from each other by the isolation region 104 in the semiconductor substrate 100, as shown in FIG. 3H. However, embodiments of the disclosure are not limited thereto. In some other embodiments, the light blocking structure 306 is in direct contact with the isolation structure 108. In some embodiments, the materials of the light blocking structure 306 and the isolation structure 108 are different from each other.

In some embodiments, the blocking material 304 outside of the recesses 302 is removed using a CMP process, a grinding process, an etching process, a lithography process, other applicable processes, or a combination thereof. Embodiments of the disclosure have many variations. In some embodiments, the light blocking material 304 is deposited only in the recesses 302 and not over the light sensing regions 106. In these cases, the removal process described in FIG. 3F is not performed.

Figure 4:
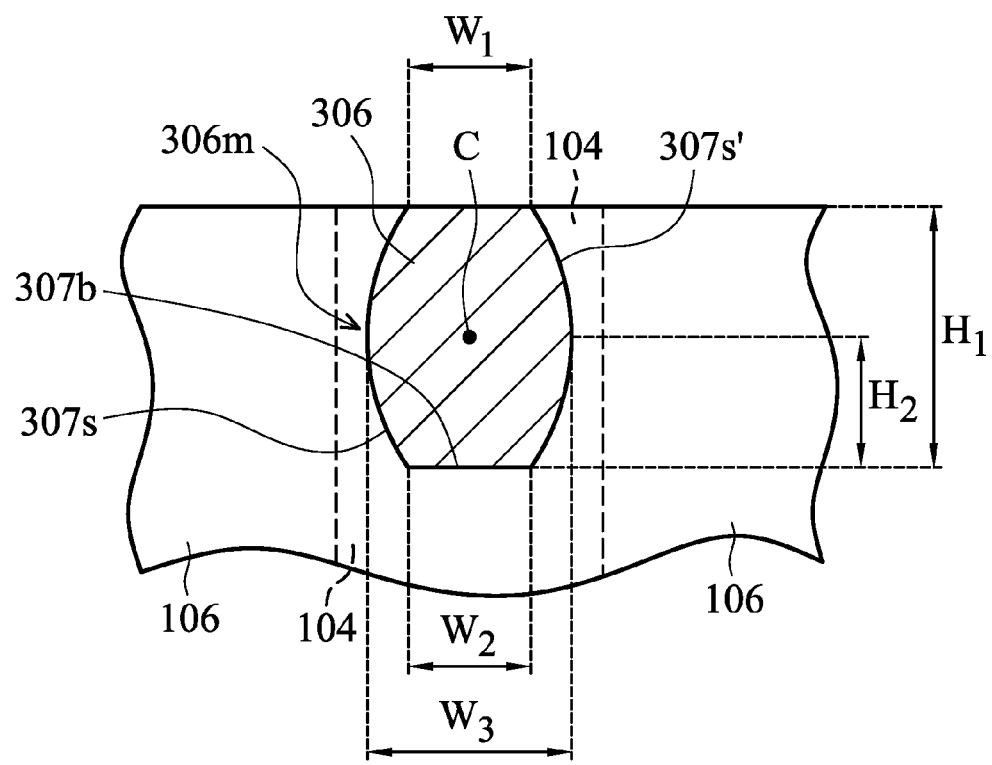
FIG. 4 is a cross-sectional view of an image sensor device, in accordance with some embodiments.

FIG. 4 is a cross-sectional view of an image sensor device, in accordance with some embodiments. FIG. 4 is an enlarged view showing the light blocking structure 306 in more detail. As shown in FIG. 4, the light blocking structure 306 has opposite sidewalls 307s and 307s', in accordance with some embodiments. In some embodiments, both the sidewalls 307s and 307s' are curved surfaces. In some embodiments, the sidewalls 307s and 307s' are substantially symmetrical to each other with respect to a center C of the light blocking structure 306. As shown in FIG. 4, the light blocking structure 306 has a bottom surface 307b. In some embodiments, the bottom surface 307b is a substantially planar surface. In some embodiments, the light blocking structure 306 has a substantially planar top surface.

As shown in FIGS. 3H and 4, the light blocking structure 306 has a width $W_1$ which is at the same level as the back surface 100b of the semiconductor substrate 100, in accordance with some embodiments. The width $W_1$ is also referred to as an opening width. As shown in FIG. 4, the light blocking structure 306 has a height $H_1$. The height $H_1$ may be the distance between the bottom surface 307b and the top of the light blocking structure 306. In some embodiments, a ratio of the width $W_1$ to the height $H_1$ ($W_1/H_1$) is in a range from about 0.3 to about 0.7. In some embodiments, the width $W_1$ is in a range from about 100 nm to about 300 nm. In some embodiments, the height $H_1$ is in a range from about 140 nm to about 1000 nm.

As shown in FIG. 4, the light blocking structure 306 has a width $W_2$ which is the width of the bottom of the light blocking structure 306. In some embodiments, the widths $W_2$ and $W_1$ are substantially the same. In some embodiments, the widths $W_2$ is greater than the widths $W_1$. In some embodiments, the widths $W_1$ is greater than the widths $W_2$.

As shown in FIGS. 4 and 3H, the widths of the light blocking structure 306 gradually increase along a direction from the back surface 100b towards a middle region 306m of the light blocking structure 306, in accordance with some embodiments. In some embodiments, the widths of the light blocking structure 306 gradually decrease along a direction from the middle portion 306m towards the bottom surface 307b of the light blocking structure 306, in accordance with some embodiments.

As shown in FIG. 4, a widest portion of the light blocking structure 306 has a height $H_2$, in accordance with some embodiments. The height $H_2$ is the distance between the bottom surface 307b and the widest portion of the light blocking structure 306. In some embodiments, the height $H_2$ is half of the height $H_1$. That is, the widest portion of the light blocking structure 306 is positioned at the middle position of the light blocking structure 306. However, embodiments of the disclosure are not limited thereto. In some embodiments, the widest portion of the light blocking structure 306 is not positioned at the middle position of the light blocking structure 306. In some embodiments, the widest portion of the light blocking structure 306 is positioned near the middle position of the light blocking structure 306. In some embodiments, a ratio of the height $H_2$ to the height $H_1$ ($H_2/H_1$) is in a range from about 0.4 to about 0.6.

Referring to FIG. 3G, an anti-reflection coating (ARC) layer 308 is deposited over the semiconductor substrate 100, in accordance with some embodiments. The ARC layer 308 is used to reduce optical reflection from the surface of the semiconductor substrate 100 to ensure that most of an incident light enters the light sensing regions 106 and is sensed. The ARC layer 308 may be made of a high-k material, a dielectric material, other suitable materials, or a combination thereof. The high-k material may include hafnium oxide, tantalum pentoxide, zirconium dioxide, aluminum oxide, other suitable materials, or a combination thereof. The dielectric material includes, for example, silicon nitride, silicon oxynitride, other suitable materials, or a combination thereof. In some embodiments, the ARC layer 308 is deposited using a CVD process, a spin-on process, a thermal oxidation process, a PVD process, other applicable processes, or a combination thereof. Embodiments of the disclosure are not limited thereto.

In some embodiments, a buffer layer (not shown) is deposited over the ARC layer 308. In some embodiments, the buffer layer is used as a buffer between the ARC layer 308 and an overlying layer subsequently formed. The buffer layer may be made of a dielectric material or other suitable materials. For example, the buffer layer is made of silicon oxide, silicon nitride, silicon oxynitride, other applicable materials, or a combination thereof. In some embodiments, the buffer layer is deposited using a CVD process, a spin-on process, a PVD process, other applicable processes, or a combination thereof. Embodiments of the disclosure are not limited thereto. In some other embodiments, the ARC layer 308 and/or the buffer layer are/is not formed.

As shown in FIG. 3G, a light guiding structure is formed over the anti-reflection coating 308, in accordance with some embodiments. In some embodiments, the light guiding structure includes a transparent layer 312 and a number of reflective structures 310. The light guiding structure is used to ensure that an incident light enters the desired light sensing region 106 without entering a neighboring undesired light sensing region. The reflective structures 310 are used to reflect light traveling towards the undesired light sensing region. Therefore, the light is reflected back to the desired light sensing region 106. Crosstalk is thus prevented or reduced, and the quantum efficiency is improved. However, embodiments of the disclosure are not limited thereto. In some embodiments, the light guiding structure is not formed.

In some embodiments, the transparent layer 312 is made of a dielectric material, such as silicon oxide, silicon nitride, silicon oxynitride, other suitable materials, or a combination thereof. In some embodiments, the reflective structures 310 are made of a metal material, a dielectric material, or a combination thereof. In some embodiments, the metal material includes aluminum, silver, copper, tungsten, gold, platinum, titanium, tin, nickel, other suitable metal materials, or a combination thereof. In some embodiments, the reflective structures 310 are made of a dielectric material different from that of the transparent layer 312. For example, the reflective structures 310 may be made of silicon nitride, silicon oxide, silicon oxynitride, other suitable materials, or a combination thereof.

The light guiding structure may be formed by a variety of methods. In some embodiments, the reflective structures 310 are formed before the transparent layer 312. In some embodiments, a reflective material layer, such as a reflective metal layer, is deposited over the ARC layer 308. Afterwards, the reflective material layer is patterned to form the reflective structures 310. For example, a photolithography process and an etching process are performed to pattern the reflective material layer. A transparent material layer is then deposited over the reflective structures 310. The transparent material layer may be planarized to form the transparent layer 310.

Alternatively, in some other embodiments, the reflective structures 310 are formed after the transparent layer 312. In some embodiments, the transparent layer 312 is deposited and patterned over the ARC layer 308. The transparent layer 312 has openings which are substantially aligned with the light blocking structures 306, respectively. For example, a photolithography process and an etching process are performed to form the openings of the transparent layer 312. Afterwards, a reflective material layer is deposited to fill the openings. A thinning process may be performed to remove the reflective material layer outside of the openings of the transparent layer 312. As a result, the reflective structures 310 are formed.

As shown in FIG. 3H, filters, such as color filters 314a and 314b, are formed over the light guiding structure, in accordance with some embodiments. In some embodiments, the color filters 314a and 314b are substantially aligned with the respective light sensing regions 106 thereunder. In some embodiments, the color filters 314a and 314b are used to filter through different wavelength bands. For example, the color filters 314a and 314b are configured to filter through two of a red wavelength band, a blue wavelength band, and a green wavelength band. In some embodiments, multiple deposition processes and photolithograph processes are performed to sequentially form the color filters 314a and 314b. In some embodiments, the filters are not formed.

As shown in FIG. 3H, lenses 316 are respectively disposed or formed over the color filters 314a and 314b, in accordance with some embodiments. The lenses 316 are used to direct or focus the incident light. In some embodiments, the lenses 316 include a microlens array. The lenses 316 may be made of a high transmittance material. For example, the high transmittance material includes transparent polymer material (such as polymethylmethacrylate, PMMA), transparent ceramic material (such as glass), other suitable materials, or a combination thereof. In some embodiments, the lenses 316 are optional and are not formed.

As shown in FIG. 3H, an incident light L is directed by the lens 312 and enters the color filter 314B in some embodiments. The incident light L is blocked and/or reflected by the sidewall of the light blocking structure 306 between the two adjacent light sensing regions 106 and sensed by the desired light sensing region 106. In some embodiments, the color filter 314B filters through visible light of a specific wavelength band to the light sensing region 106. Due to the light blocking structure 306 therebetween, the incident light filtered by the color filter 314B is prevented from entering the adjacent light sensing region 106 which is supposed to sense an incident light only filtered by the color filter 314a. Therefore, the crosstalk issues are significantly reduced or prevented.

Embodiments of the disclosure provide structures and formation methods of image sensor devices with one or more embedded light blocking structures. A recess is formed in a semiconductor substrate using a suitable etching process to prevent or reduce damage to the semiconductor substrate. The suitable etching process includes an isotropic etching process, such as a wet etching process. Afterwards, a light blocking material is filled in the recess to form the light blocking structures. Crosstalk between neighboring pixel regions in the semiconductor substrate are prevented or significantly reduced. Since no serious damage is caused during the formation of the recess, dark current and white pixel issues are also greatly reduced. The yield and performance of the image sensor device are improved.

In accordance with some embodiments, an image sensor device is provided. The image sensor device includes a semiconductor substrate and a light sensing region in the semiconductor substrate. The image sensor device also includes a light blocking structure in the semiconductor substrate and adjacent to the light sensing region. A sidewall of the light blocking structure is a curved surface.

In accordance with some embodiments, an image sensor device is provided. The image sensor device includes a semiconductor substrate and a first light sensing region and a second light sensing region in the semiconductor substrate. The image sensor device also includes a light blocking structure in the semiconductor substrate and between the first light sensing region and the second light sensing region. Opposite sidewalls of the light blocking structure are curved surfaces.

In accordance with some embodiments, a method for forming an image sensor device is provided. The method includes forming a light sensing region in a semiconductor substrate. The method also includes forming a recess in the semiconductor substrate by using an isotropic etching process. The method further includes forming a light blocking structure in the recess, and a sidewall of the light blocking structure is a curved surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
a semiconductor substrate;
a light sensing region in the semiconductor substrate; and
a light blocking structure in the semiconductor substrate and adjacent to the light sensing region, wherein a sidewall of the light blocking structure in a cross-sectional view of the image sensor is a curved surface, wherein the cross-sectional view of the image sensor is taken along an imaginary plane parallel to a normal direction of a top surface of the semiconductor substrate.

2. The image sensor device as claimed in claim 1, wherein the light blocking structure comprises a reflective material.

3. The image sensor device as claimed in claim 1, wherein the light blocking structure comprises a metal material.

4. The image sensor device as claimed in claim 1, further comprising an isolation region in the semiconductor substrate and surrounding the light blocking structure, wherein the isolation region is a doped region.

5. The image sensor device as claimed in claim 1, wherein the light blocking structure extends from a first surface towards a second surface of the semiconductor substrate.

6. The image sensor device as claimed in claim 5, further comprising an isolation structure in the semiconductor substrate and extending from the second surface towards the first surface of the semiconductor substrate.

7. The image sensor device as claimed in claim 5, wherein the light blocking structure has a width at the same level as the first surface and a height, and a ratio of the width to the height is in a range from about 0.3 to about 0.7.

8. The image sensor device as claimed in claim 5, wherein widths of the light blocking structure gradually increase along a direction from the first surface towards a middle region of the light blocking structure.

9. The image sensor device as claimed in claim 8, wherein widths of the light blocking structure gradually decrease along a direction from the middle region towards the bottom of the light blocking structure.

10. The image sensor device as claimed in claim 1, wherein the light blocking structure has a substantially planar bottom surface.

11. An image sensor device, comprising:
a semiconductor substrate;
a first light sensing region and a second light sensing region in the semiconductor substrate; and
a light blocking structure in the semiconductor substrate and between the first light sensing region and the second light sensing region, wherein opposite sidewalls of the light blocking structure in a cross-sectional view of the image sensor are curved surfaces, wherein the cross-sectional view of the image sensor is taken along an imaginary plane parallel to a normal direction of a top surface of the semiconductor substrate.

12. The image sensor device as claimed in claim 11, wherein the light blocking structure comprises a metal material.

13. The image sensor device as claimed in claim 11, further comprising an isolation region in the semiconductor substrate and between the first light sensing region and the second light sensing region, wherein the isolation region surrounds the light blocking structure.

14. The image sensor device as claimed in claim 11, wherein the opposite sidewalls of the light blocking structure in the cross-sectional view of the image sensor are substantially symmetrical to each other with respect to a center of the light blocking structure.

15. The image sensor device as claimed in claim 11, further comprising a light guiding structure over the semiconductor substrate.

16. An image sensor device, comprising:
a semiconductor substrate;
a first light sensing region and a second light sensing region in the semiconductor substrate;
a light blocking structure in the semiconductor substrate and between the first light sensing region and the second light sensing region, wherein opposite sidewalls of the light blocking structure are curved surfaces; and
a light guiding structure over the semiconductor substrate, wherein the light guiding structure comprises a reflective structure, and the light blocking structure and the reflective structure are substantially aligned with each other.

17. The image sensor device as claimed in claim 11, wherein the light blocking structure extends from a first surface towards a second surface of the semiconductor substrate.

18. The image sensor device as claimed in claim 17, further comprising an isolation structure in the semiconductor substrate and extending from the second surface towards the first surface of the semiconductor substrate.

19. The image sensor device as claimed in claim 18, wherein the light blocking structure and the isolation structure are substantially aligned with each other.

20. The image sensor device as claimed in claim 18, wherein the light blocking structure and the isolation structure are separated from each other.

* * * * *